United States Patent
Wang et al.

(10) Patent No.: US 9,099,389 B2
(45) Date of Patent: Aug. 4, 2015

(54) METHOD AND APPARATUS FOR REDUCING STRIPE PATTERNS

(75) Inventors: Chung Chien Wang, Shanhua Township (TW); Yeur-Luen Tu, Taichung (TW); Cheng-Ta Wu, Shueishang Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 732 days.

(21) Appl. No.: 13/371,303

(22) Filed: Feb. 10, 2012

(65) Prior Publication Data

US 2013/0210188 A1 Aug. 15, 2013

(51) Int. Cl.
*H01L 21/268* (2006.01)
*H01L 27/146* (2006.01)

(52) U.S. Cl.
CPC .......... *H01L 21/268* (2013.01); *H01L 27/1464* (2013.01); *H01L 27/14689* (2013.01)

(58) Field of Classification Search
CPC ............ H01L 21/268; H01L 27/14689; H01L 27/1464
USPC .................................................... 438/73, 795
See application file for complete search history.

(56) References Cited

U.S. PATENT DOCUMENTS

| 7,901,974 | B2 * | 3/2011 | Venezia et al. | 438/73 |
| 8,017,427 | B2 * | 9/2011 | Manabe | 438/72 |
| 8,018,016 | B2 | 9/2011 | McCarten et al. | |
| 8,278,690 | B2 | 10/2012 | Mao et al. | |
| 8,304,354 | B2 | 11/2012 | Hsu et al. | |
| 8,390,089 | B2 | 3/2013 | Chen et al. | |
| 8,628,998 | B2 * | 1/2014 | Lin et al. | 438/89 |
| 2010/0220226 | A1 * | 9/2010 | Wang et al. | 348/294 |
| 2011/0263069 | A1 | 10/2011 | Hsu et al. | |

FOREIGN PATENT DOCUMENTS

| JP | 2008177485 | A | * | 7/2008 |
| KR | 2010078631 | A | * | 7/2010 |
| TW | 201112411 | | | 4/2011 |
| TW | 201137977 | | | 11/2011 |
| TW | 201137980 | | | 11/2011 |
| TW | 201205793 | | | 2/2012 |

* cited by examiner

*Primary Examiner* — Mary Wilczewski
*Assistant Examiner* — Toniae Thomas
(74) *Attorney, Agent, or Firm* — Slater & Matsil, L.L.P.

(57) ABSTRACT

A method for reducing stripe patterns comprising receiving scattered light signals from a backside surface of a laser annealed backside illuminated image sensor wafer, generating a backside surface image based upon the scattered light signals, determining a distance between an edge of a sensor array of the laser anneal backside illuminated image sensor wafer and an adjacent boundary of a laser beam and re-calibrating the laser beam if the distance is less than a predetermined value.

20 Claims, 5 Drawing Sheets

METHOD AND APPARATUS FOR REDUCING STRIPE PATTERNS

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers in the light path may limit the amount of light absorbed by the photo diode so as to reduce quantum efficiency. In contrast, in a BSI image sensor, light is incident on the backside of the CMOS image sensor without the obstructions from the additional layers. As a result, light can hit the photo diode through a direct path. Such a direct path helps to increase the number of photons converted into electrons.

In order to improve quantum efficiency of BSI image sensors, the substrate of BSI image sensors is thinned to a thickness in a range from about 2 um to 2.5 um. In addition, through an ion implantation process, a thin P+ layer having a thickness of about 100 Å may be formed on the thinned substrate to further improve quantum efficiency. Subsequently, a laser annealing process may be performed to activate the implanted P+ ions as well as repair crystal defects caused by the ion implantation process. Such a laser annealing process may cause dark mode image stripe patterns due to laser scanning boundary effects on the image sensor arrays.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a method for reducing image stripe patterns of a backside illuminated (BSI) image sensor. The embodiments of the disclosure may also be applied, however, to a variety of complementary metal-oxide semiconductor (CMOS) image sensors.

A BSI image sensor wafer 100 may comprise a plurality of image sensors and their corresponding peripheral circuits. According to the fabrication processes of BSI image sensors, the backside the substrate of the BSI image sensor wafer 100 may be thinned to a thickness in a range from about 2 um to about 2.5 um so that light can pass through the substrate (not shown) and hit photo diodes embedded in the substrate. Furthermore, a thin P+ ion layer may be formed on the backside of the thinned substrate to increase the number of photons converted into electrons. The P+ ion implantation process may cause crystal defects. In order to repair crystal defects and activate the implanted P+ ions, a laser annealing process may be performed on the backside of the BSI image sensor wafer 100.

Figure 1B:
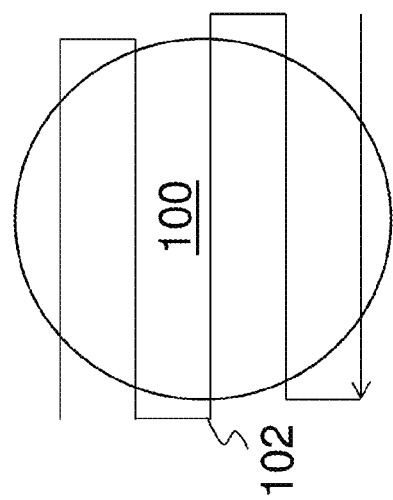
FIGS. 1A-1D illustrate an image pattern on a backside of a backside illuminated (BSI) image sensor wafer post a laser annealing process.
Figure 1A:
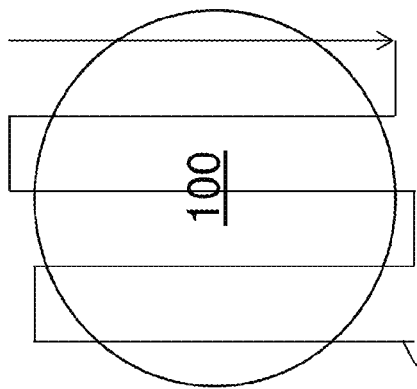
Figure 1C:
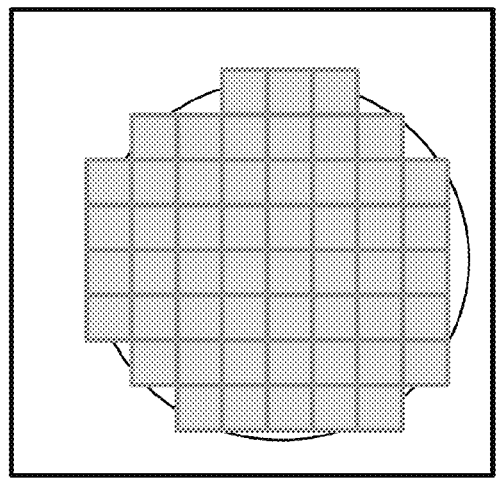

Referring initially to FIG. 1A, a horizontal laser scan of a BSI image sensor wafer is illustrated in accordance with an embodiment. A meandering line 102 indicates the movement path of a laser beam (not shown). Alternatively, a laser annealing process can be implemented by using a vertical laser scan of a BSI image sensor wafer 100 as shown in FIG. 1B. In accordance with an embodiment, the laser beam may be a line laser having an effective boundary size of 7 um by 27 mm. Furthermore, as shown in FIG. 1C, the laser beam may be a square laser having an effective boundary size of 15 mm by 15 mm. The detailed operation of the laser annealing process is well known in the art, and hence is not discussed herein to avoid repetition.

Figure 1D:
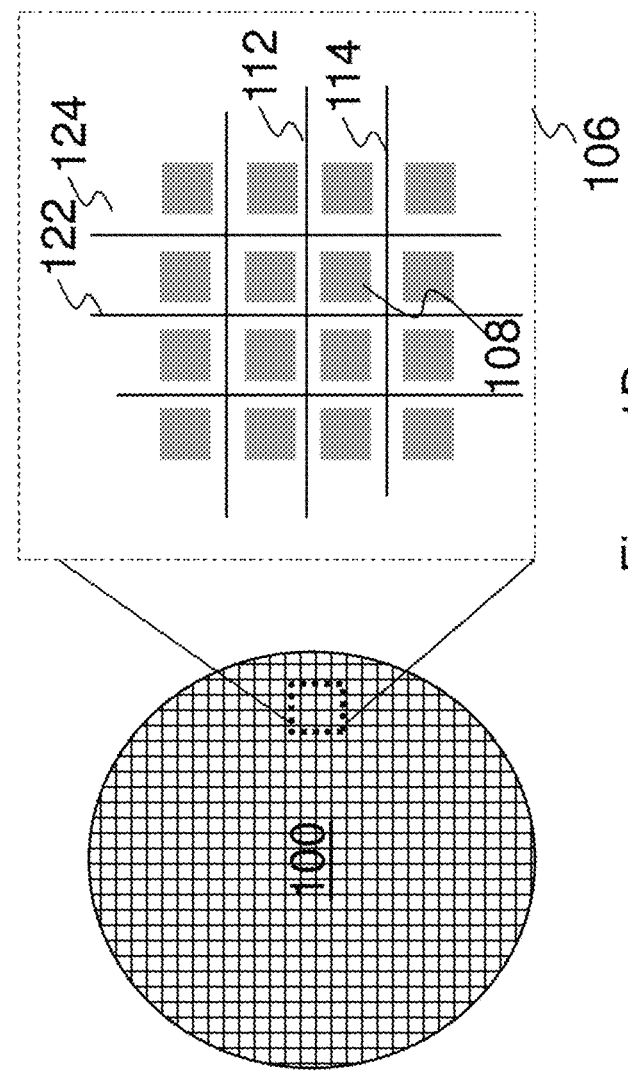

The boundary of the laser beam may be slightly greater than the boundary of an image sensor array (e.g., sensor array 108 shown in FIG. 1D). The boundary of the laser beam may generate a corresponding high laser energy region on the BSI image sensor wafer 100 because there may be a laser overlapping spot at the boundary of the laser beam when the laser beam moves along the path shown in FIG. 1A. Alternatively, the laser anneal process can be implemented by vertically scanning the BSI image sensor wafer 100 as shown in FIG. 1B. A meandering line 104 indicates the movement path of the laser beam. Similar to the horizontal laser scan, the vertical laser scan may cause a higher laser energy distribution at the boundary between two adjacent sensor arrays. Moreover, a square laser may have boundary effects, which may cause stripe patterns if the boundary of the square laser overlaps with the sensor.

FIG. 1D illustrates a top view of the backside of the BSI image sensor wafer post a laser annealing process in accordance with an embodiment. As shown in FIG. 1D, there may be a plurality of squares on the backside of the BSI image sensor wafer 100. Each square represents the boundary of a laser beam scanning through the BSI image sensor wafer 100. In order to better illustrate the detailed location relation between a boundary of the laser beam and a boundary of an image sensor array of the wafer 100, a portion of the BSI image sensor wafer 100 is enlarged in the dashed rectangle 106.

As shown in FIG. 1D, each gray square represents a sensor array, which may comprise a plurality of image sensors (not shown). Furthermore, each gray square (e.g., 108) is enclosed by a square formed by lines 112, 114, 122 and 124. The square represents the boundary of the laser beam. In order to avoid dark mode image stripe patterns, the laser beam is selected such that the laser beam boundary is not within gray squares (e.g., 108). However, due to process and laser equipment operation variations, the position of the laser beam may shift so that the laser beam boundary may fall within gray squares, with a concomitant image stripe pattern in the image sensors. As such, it is necessary to detect the location relation between the boundary of a laser beam and the boundary of image sensor arrays.

Figure 2:
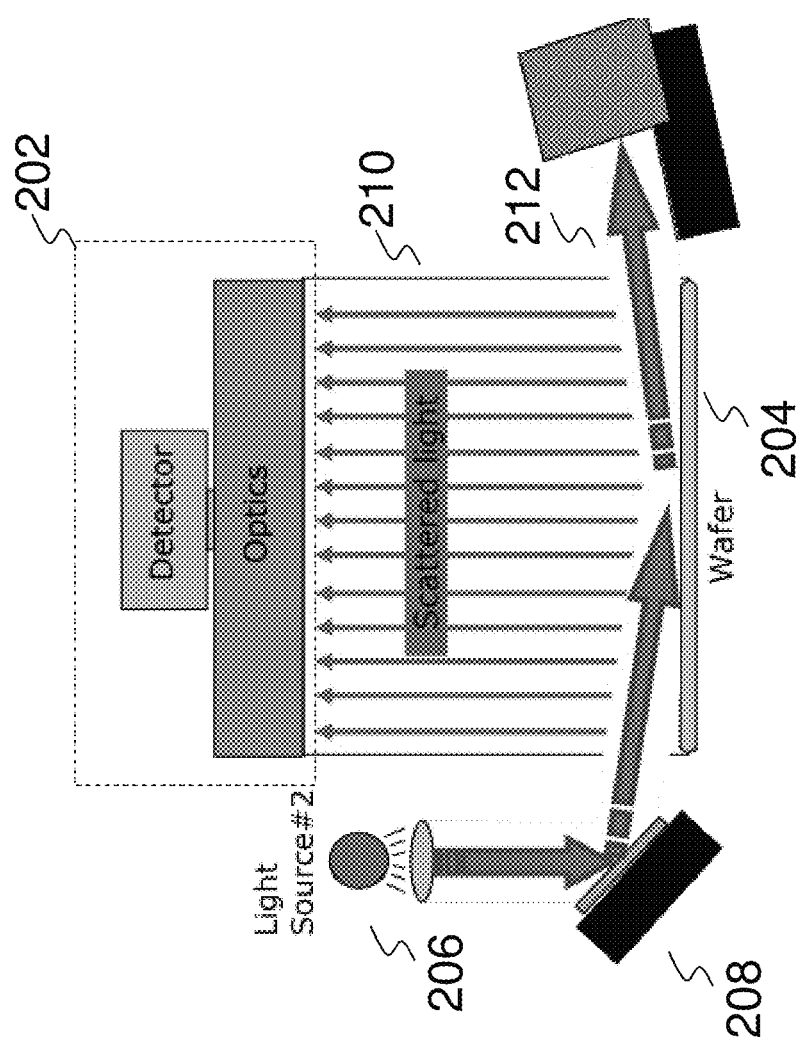
FIG. 2 illustrates a method of detecting a location relation between the boundary of a laser beam and the boundary of an image sensor array in accordance with an embodiment.

FIG. 2 illustrates a method of detecting the location relation between the boundary of a laser beam and a boundary of an image sensor array in accordance with an embodiment. After a laser annealing process, a light source 206 is applied to the backside surface of a BSI image sensor wafer 204 through a minor 208. In accordance with an embodiment, the light source has a wavelength in a range from about 300 nm to about 400 nm. As shown in FIG. 2, by employing the minor 208, a small incident angle can be achieved. Such a small incident angle helps to increase the intensity of the scattered light 210.

An optical detector 202 is employed to receive the scattered light and further analyze the image pattern retrieved from the scattered light. In accordance with an embodiment, the optical detector 202 may be implemented by using a haze measurement function from surface scanners (e.g., KLA-Tencor SP2). One advantageous feature of analyzing the image pattern of a BSI sensor wafer is that the location relation between the boundary of a laser beam and the boundaries of sensor arrays can be determined. As such, if the laser beam boundary falls within the boundary of a sensor array, the laser annealing equipment will be fine-tuned so that the laser beam boundary is outside the boundaries of sensor arrays.

Figure 3:
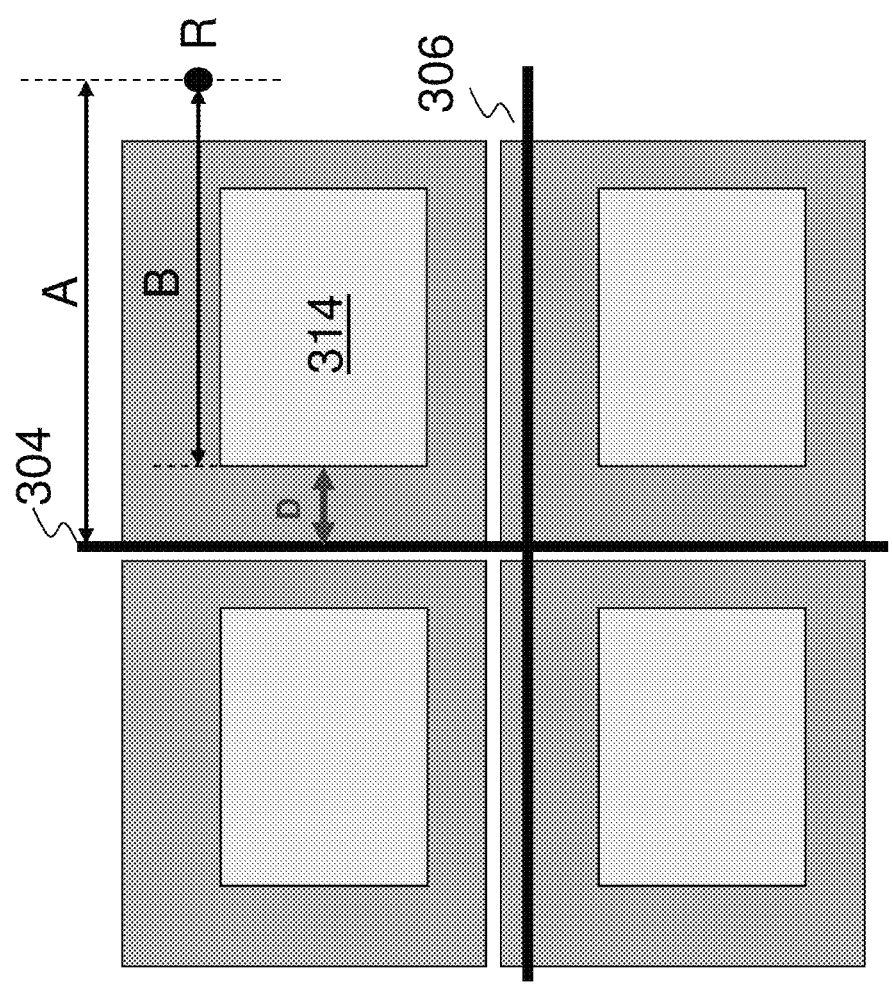
FIG. 3 illustrates an exemplary location relation between the laser beam boundary and the sensor array boundary in accordance with an embodiment.

FIG. 3 illustrates an exemplary location relation between the laser beam boundary and the sensor array boundary in accordance with an embodiment. Each sensor array may comprise four images sensors. In addition, each sensor array is enclosed by a white square representing the laser beam boundary. As shown in FIG. 3, a sensor 314 is adjacent to a first laser boundary line 304 and a second laser beam boundary line 306. The distance between a left edge of the sensor 314 and a reference point R is defined as B. Likewise, the distance between the boundary line 304 and the reference point R is defined as A. The process margin of the laser annealing process is defined as D, which is the difference between A and B. In accordance with an embodiment, when D is greater than a predetermined value (e.g., 200 um), the laser annealing process has enough margin and image stripe patterns may not occur. On the other hand, when D is less than the predetermined value, image stripe patterns may occur due to process and operation variations. As a consequence, the laser annealing equipment may be re-calibrated so as to keep the laser beam boundary from falling into the sensor array boundary.

Figure 4:
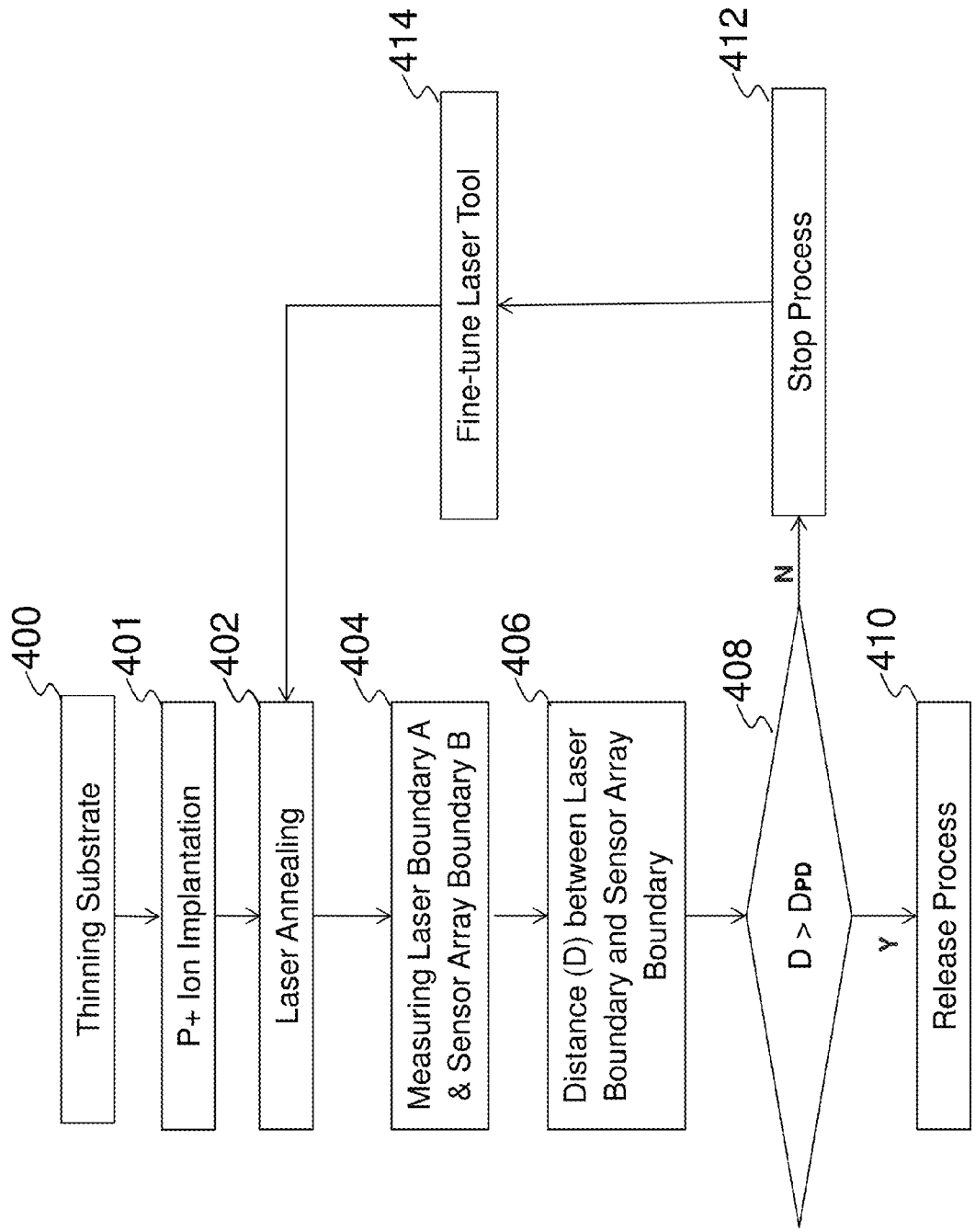
FIG. 4 illustrates a flow chart of a method for reducing image stripe patterns in accordance with an embodiment.

FIG. 4 illustrates a flow chart of a method for reducing image stripe patterns in accordance with an embodiment. At step 400, there may be a plurality of BSI image sensor wafers. According to the fabrication process of a BSI image sensor wafer, a substrate thinning process is performed on the backside of the substrate so that the thickness of the substrate is reduced to a range from about 2 um to about 2.5 um. Such a thinned substrate helps to allow light to propagate from the backside of the substrate. In other words, light can pass through the backside of the substrate and reach the photo active layers (e.g., photo diodes) without being absorbed.

At step 401, through an ion implantation process, a thin P+ layer may be formed on the thinned substrate to improve quantum efficiency. In accordance with an embodiment, the thin P+ layer has a thickness in a range from about 100 Å to about 1 um. At step 402, a laser annealing process is performed on the backside of the substrate to repair defects due to the P+ ion implantation and activate P+ ions. It should be noted that a laser beam in a laser annealing process may not have uniform energy distribution. For example, the energy density at the boundary region of the laser beam is not equal to the energy density at the center of the laser beam. In addition, there may be an overlapping laser spot at two adjacent image sensors when a laser beam scans through the two adjacent image sensors. Such an overlapping laser spot may lead to an image stripe pattern if it falls into the image sensor boundary. In other words, even if light does not hit the photo active layers of a BSI image sensor, the image sensor may still generate electrons. As such, an estimate of the boundary of a laser beam as well as the boundary of a sensor array is necessary to prevent the laser annealing process from generating image stripe patterns.

At step 404, a light source is applied to a laser-annealed wafer. From the scattered light pattern received by an optical detector, both the boundary of an image sensor array and the boundary of a laser beam can be calculated based upon the scattered light pattern. For example, the distance from an edge of an image sensor to a reference point is defined as B. The distance from an adjacent edge of a laser beam to the reference point is defined as A. At step 406, after measuring A and B, the distance between the laser beam and the image sensor can be calculated by subtracting B from A.

At step 408, if D is smaller than a predetermined value (e.g., 200 um), then the algorithm executes step 412 wherein the laser annealing process stops at step 412 and a fine-tune process of the laser annealing tool is performed at step 414. On the other hand, if D is greater than the predetermined value, the algorithm executes step 410 wherein the algorithm releases the laser annealing process for other BSI image sensor wafers.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   implanting sensors in a wafer;
   applying a laser beam to anneal the wafer, wherein the laser beam has a boundary size greater than a boundary size of a sensor array formed by a plurality of sensors;
   applying an incident light to a surface of the wafer;
   receiving scattered light signals from the incident light;
   generating a surface image based upon the scattered light signals;
   determining a distance between an edge of the sensor array of the wafer and an adjacent boundary of a laser beam; and
   re-calibrating the laser beam if the distance is less than a predetermined value.

2. The method of claim 1, further comprising:
   measuring a first distance between an edge of the sensor array and a reference point;
   measuring a second distance between a laser beam boundary line and the reference point, wherein the laser beam boundary line is adjacent to the edge of the sensor array; and
   calculating a laser annealing margin by subtracting the first distance from the second distance.

3. The method of claim 1, further comprising:
   positing the laser beam so that a laser beam boundary falls outside the sensor array.

4. The method of claim 1, further comprising:
   performing a laser annealing process on a first backside illuminated image sensor wafer;
   calculating a laser annealing margin based upon the distance; and
   performing the laser annealing process on a second backside illuminated image sensor wafer if the laser annealing margin is greater than the predetermined value.

5. The method of claim 1, further comprising:
   thinning a backside of a substrate of a backside illuminated image sensor wafer;
   implanting P+ ions on the backside of the substrate; and
   performing a laser annealing process using a laser beam.

6. The method of claim 1, further comprising:
   providing a light source; and
   configuring the light source and a mirror so that light from the light source hits a backside surface of a laser annealed backside illuminated image sensor wafer with a small incident angle.

7. The method of claim 6, wherein the light source has a wavelength in a range from 300 nm to 400 nm.

8. A method comprising:
   forming a plurality of sensor arrays in a wafer;
   performing a thinning process on a backside of the wafer;
   forming a P+ ion implantation layer on the backside of the wafer;
   performing a laser annealing process on the P+ ion implantation layer using a laser beam, wherein the laser beam has a boundary size greater than a boundary size of a sensor array formed by a plurality of sensors;
   applying light on the backside of the wafer with an incident angle;
   receiving scattered light signal from the backside;
   determining a distance between a sensor array boundary and an adjacent laser beam boundary; and
   re-calibrating the laser beam if the distance is less than a predetermined value.

9. The method of claim 8, further comprising:
   repairing crystal defects caused by a P+ ion implantation process; and
   activating P+ ions using the laser beam.

10. The method of claim 8, further comprising:
    thinning the backside of a backside illuminated sensor wafer to a thickness in a range from 2 um to 2.5 um.

11. The method of claim 8, further comprising:
    detecting the scattered light signal using an optical detector;
    generating a backside surface image of the wafer;
    determining a first location of a sensor array boundary from the backside surface image;
    determining a second location of a laser beam boundary; and
    calculating a location relation between the sensor array boundary and the laser beam boundary.

12. The method of claim 11, further comprising:
    repositioning the laser beam if the sensor array boundary overlaps with the laser beam boundary.

13. The method of claim 8, further comprising:
    performing the laser annealing process on the P+ ion implantation layer using a square laser beam, wherein a square boundary of the square laser beam is bigger than the sensor array boundary.

14. A method comprising:
    providing a wafer comprising a plurality of image sensors;
    applying a laser annealing process to a backside of the wafer;
    directing light from a light source to a top surface of the backside of the wafer with a small incident angle;
    retrieving an image pattern of the backside of the wafer by analyzing scattered light from the top surface of the backside of the wafer;
    measuring a distance between an image sensor boundary and a laser beam boundary; and
    recalibrating the laser annealing process if the distance is less than a predetermined value.

15. The method of claim 14, further comprising:
    applying the laser annealing process to the backside of the wafer using a laser beam, wherein the laser beam has a boundary size greater than a boundary size of an image sensor.

16. The method of claim 15, wherein:
the laser beam is a square laser beam.

17. The method of claim 14, further comprising:
coupling a mirror between the light source and the top surface of the backside of the wafer.

18. The method of claim 17, wherein:
the mirror is configured such that the light from the light source hits the top surface of the backside of the wafer with the small incident angle.

19. The method of claim 18, wherein:
the small incident angle is less than 90 degrees.

20. The method of claim 14, further comprising:
prior to the step of applying the laser annealing process to the backside of the wafer, thinning the backside of the wafer; and
implanting P+ ions on the backside of the wafer.

* * * * *